(12) United States Patent
Maeno et al.

(10) Patent No.: US 6,222,738 B1
(45) Date of Patent: Apr. 24, 2001

(54) PACKAGING STRUCTURE FOR A SEMICONDUCTOR ELEMENT FLIP-CHIP MOUNTED ON A MOUNTING BOARD HAVING STAGGERED BUMP CONNECTION LOCATION ON THE PADS AND METHOD THEREOF

(75) Inventors: Yoshinobu Maeno, Kawasaki; Kenichiro Abe; Kouzi Soekawa, both of Nagano, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/040,394

(22) Filed: Mar. 18, 1998

(30) Foreign Application Priority Data

Oct. 20, 1997 (JP) ................................... 9-287461

(51) Int. Cl.[7] ............................................. H01L 23/48
(52) U.S. Cl. ................ 361/772; 361/783; 257/775; 257/778; 257/786; 257/738; 257/787; 438/108; 438/127; 438/617; 29/841
(58) Field of Search ................................ 174/260, 261; 257/723, 724, 737, 738, 778, 786, 692, 693, 697, 773, 775, 780, 787; 361/761–764, 777, 820, 772–774, 783; 438/613, 108, 126, 127, 617, 119; 29/832, 840, 841

(56) References Cited

U.S. PATENT DOCUMENTS

| | | | | |
|---|---|---|---|---|
| 5,386,624 | * | 2/1995 | George et al. | 29/840 |
| 5,628,919 | * | 5/1997 | Tomura et al. | 216/18 |
| 5,641,996 | * | 6/1997 | Omoya et al. | 257/780 |
| 5,856,212 | * | 1/1999 | Chun | 438/126 |
| 5,965,948 | * | 10/1999 | Okamoto | 257/786 |

FOREIGN PATENT DOCUMENTS 2-251146  *  10/1990  (JP) ..................................... 257/786

OTHER PUBLICATIONS

IBM Technical Disclosure Bulletin Bulletin "Unique Pad For Optimum Solder Application" Jun. 1991.*

* cited by examiner

*Primary Examiner*—Jeffrey Gaffin
*Assistant Examiner*—John B. Vigushin
(74) *Attorney, Agent, or Firm*—Armstrong, Westerman, Hattori, McLeland & Naughton, LLP

(57) ABSTRACT

A packaging structure of semiconductor elements and for mounting such elements on which high density pads are formed on a board at a high production yield, where bumps or gold wires are bonded in a staggered manner within a pad on a semiconductor element. The spaces between bumps or gold wires can be widened without changing the semiconductor element.

6 Claims, 7 Drawing Sheets

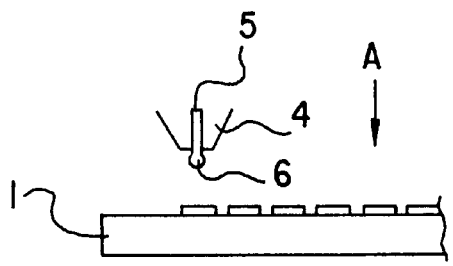
Fig.1(a)
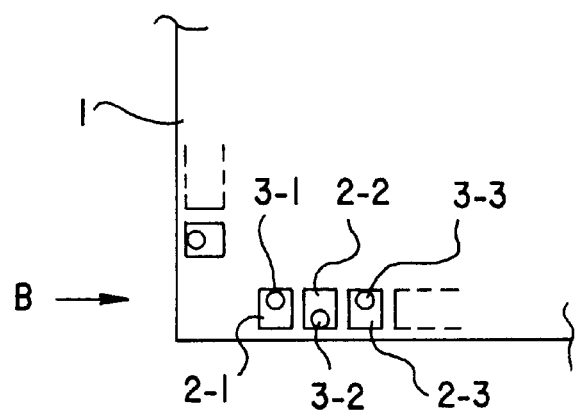
Fig.1(b)
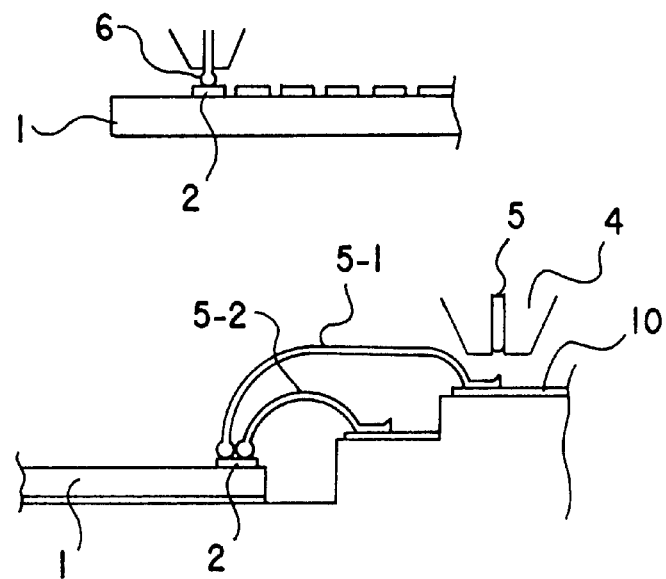
Fig.1(c)
Fig.1(d)
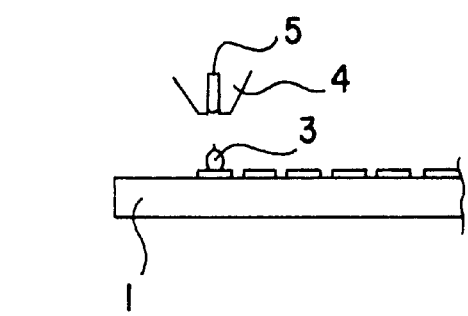
Fig.1(e)

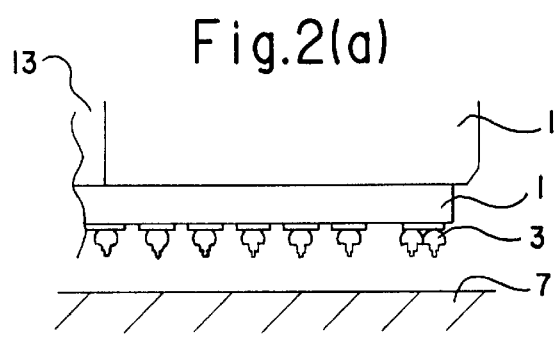
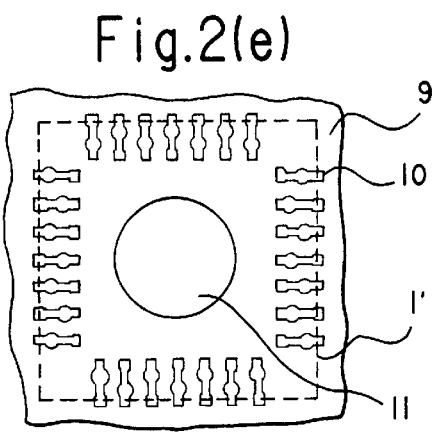
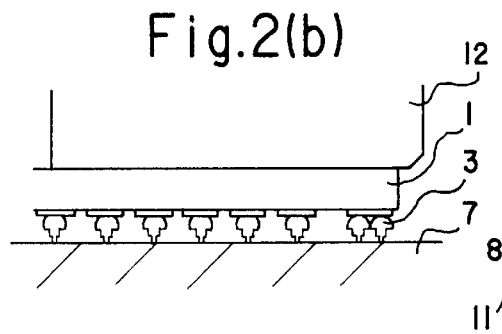
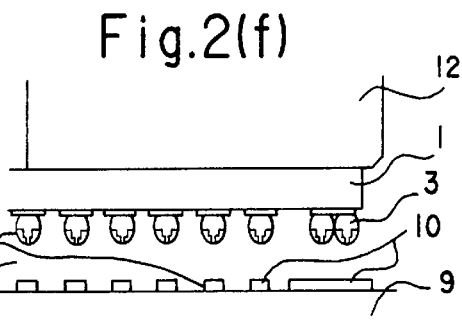
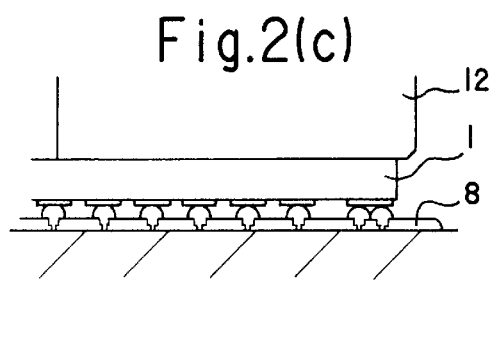
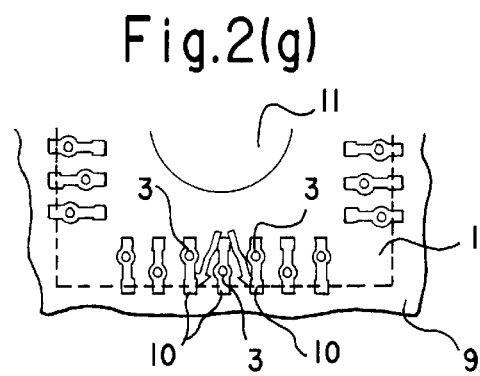
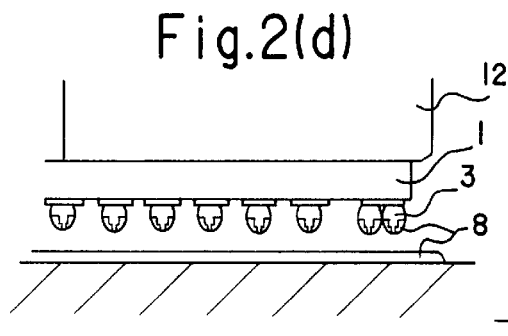
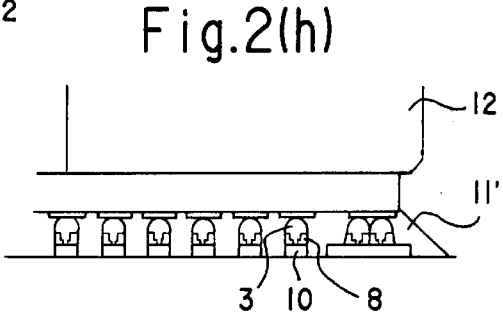

PACKAGING STRUCTURE FOR A SEMICONDUCTOR ELEMENT FLIP-CHIP MOUNTED ON A MOUNTING BOARD HAVING STAGGERED BUMP CONNECTION LOCATION ON THE PADS AND METHOD THEREOF

BACKGROUND OF THE INVENTION

1. Field of the Invention

This invention is related to a packaging structure of semiconductor elements and, more particularly, to a packaging structure for high yield packaging of semiconductor elements on which pads are formed with high density.

Semiconductor elements currently being mounted on a PC board are required to be compact and light in weight and, moreover, they are required to be driven at a high frequency. Accordingly, downsizing of the board itself is required and the high-density packaging of semiconductor elements is required.

2. Description of the Related Art

FIGS. 5(a)–5(c) show a prior art structure for mounting semiconductor elements onto a board at high density. FIG. 5(a) shows the mounting of an SOP package of semiconductor elements; FIG. 5(b) shows the mounting of a PGA package of semiconductor elements; and FIG. 5(c) shows the mounting of a BGA package of semiconductor elements. Furthermore, corresponding numbers in these figures indicate components which have the same function.

SOP package 1, as shown in FIG. 5(a), is connected to footprint 4 provided on a board through a lead extending outwardly from a package by soldering. SOP package 1 is a compact package of semiconductor elements mounted on the surface of a board, where the lead wire 2 is very thin and the space between the leads is extremely narrow. As a result, the space between the footprint 4 corresponding to the lead wire 2 must also be narrow, so the footprint must have a rectangular shape, as shown in the figure. The solder used in mounting SOP package 1 is a solder paste and is supplied by screen printing. In order to make screen printing smooth, there is a case using a structure in which the corners of footprint may be chamfered. Furthermore, in the SOP package 1 shown in FIG. 5(a), since lead wires on the SOP package 1 could not be completely arranged, there is a QFP package having leads all around a package.

Conversely, where a number of terminals cannot be ensured only around the package such as SOP, QFP, or where the density of terminals cannot be increased due to terminal connections with sockets, there is known a PGA package in which the terminals are arranged in two or more rows.

As shown in FIG. 5(b), PGA package 1 has pins 2 extending downward from the package, which are arranged in a matrix, and which are soldered to the footprint 4 provided on the board 3 corresponding to the pins 2. In this case, while it is possible to form the footprint 4 in a square shape where the density of pins is low, where the density of pin is high the footprint is formed in a circular shape.

There is also known a BGA package for more higher density packaging. Most BGAs are similar in size to silicon boards (hereinafter referred to as "bare chips") on which semiconductor element circuits are structured, and are used in so-called chip scale packages.

As shown in FIG. 5(c), BGA package 1 has terminals connected to aluminum electrodes formed on the bare chip along the entire bottom surface of the package, and solder balls 2 are formed on these terminals. The solder balls 2 of the BGA package 1 are connected to the footprint 4 by melting the solder ball 2 through heating the board 3 in a furnace after the solder balls 2 have been positioned and mounted on the round shape footprint 4 provided on the board 3.

All these prior art packages enable the easy mounting of semiconductor elements onto the board by extending lead wires from terminals of a bare chip and by connecting the lead wires to terminals which have a lower density than that of terminals of the bare chip. However, there is a method of mounting directly to the board 3 without converting the terminal density of the bare chips to a lower terminal density as described above.

FIGS. 6(a)–6(e) are diagrams for explaining a prior art packaging method which is a method of packaging a bare chip directly to a board called "facedown bonding" or "flip-chip bonding". FIGS. 7(a)–7(b) are diagrams showing pads on a bare chip and footprints on a board.

As shown in FIG. 6(a), bump 53 is formed on the pads 52 of a bare chip 51. When the end of the gold wire 55 provided at the end of the capillary 54 of the wire bonder is heated and melted, a ball 56 is formed by the surface tension of the gold. Then, when the ball 56 is crimped onto the pad 52, the ball 56 is fixed to the pad 52. Then, by moving the capillary up in the figure, the gold wire 55 is cut, and a bump 53 is formed. At this time, bump 53 is positioned at the center of the pad 52, as shown in FIG. 7(a). This insures that failure rarely occurs, even if the forming position of a bump shifts in any direction due to inaccurate positioning of a machinery or the tolerance of dimensional precision of the bare chip. Next, as shown in FIG. 6(b), the bare chip 51 is pressed to face a surface forming the bumps 53 to a glass 57. By pressing the bare chip 51 to the glass 57 whose surface is formed as flat, the cut-out gold wire 55 remaining at the end of the bump 53 is squashed, and then the heights of all bumps 53 are uniform. Next, if, as shown in FIG. 6(c), the bumps 53 dip to a surface thinly coated with conductive adhesive 58, the conductive adhesive 58 coats only the bumps 53. Next, as shown in FIG. 6(d), the bare chip 51 is positioned and pressed onto a board 59 by a mounting device called a flip-chip bonder. At this time, as shown in FIG. 7(b), an adhesive 61, which is made of thermosetting resin for securing the bare chip is coated in the center, which is a position of mounting the bare chip on the board 59, of the area surrounded by footprint 60, so the adhesive 61 is spread toward the periphery by pressing the bare chip 51 onto the board 59. As shown in FIG. 6(e), while the bare chip 51 is being pressed onto the board 59, the adhesive 61 is spread around the bare chip through the spaces between the bump 53. Then, due to the surface tension of the adhesive 61, a fillet 61', which covers the sides of the bare chip, is formed. By then heating the board in a furnace in this state, the adhesive 61 hardens and the bare chip is mounted.

All footprints used in packages such as the SOP, PGA, BGA, etc., as described above, are formed in a manner such that the width of the footprints is greater than the wiring patterns formed on the boards. The incomplete forming of footprints does not adversely affect the production yield of the boards. However, when using packages, it is difficult to increase the packaging density, to reduce weight, or to improve thermal radiation efficiency. For example, there is a requirement to mount bare chips on the boards even in portable personal computers. For the flip-chip mounting of bare chips with a high terminal density, however, it is typical to use boards manufactured by using thin film technology. From this, the footprints used to mount bare chips are formed in a manner such that the width of each footprint is greater than the diameter of each of the wires formed on a board, as described above. However, because the production yield of boards using thin film technology is low, such boards cannot be manufactured at a low enough cost to be used in low-priced consumer products such as personal computers.

Multi-layered boards manufactured with thick-film technology are formed in a manner such that a plurality of double-sided boards containing a copper pattern having a thickness of about 20 μm are adhered to one another, and thereafter the through-holes are formed by plating. In this case, each copper pattern formed on the surface has a thickness of about 40 μm. Consequently, it is necessary that the width of wiring pattern and the spaces between patterns are respectively 150 μm, therefore, patterns with a pitch of at minimum 300 μm can be formed. To solve this problem, a built-up board forming a printed circuit by thick-film is provided in a manner such that insulated polyimide film and copper film are layered on these boards to be used as a core, and then the copper film is etched. By using this built-up board, it is possible to form more minute wiring patterns. However, even if such a built-up board is used, the thickness of the wiring patterns is still about 10 to 15 μm, and because 50 μm is required both for the width of each wiring pattern and for the spaces between the patterns, it is only possible to form a pattern with a pitch of 100 μm.

Conversely, because the gaps between pads of bare chips are defined and manufactured by a chip maker, custom chips having a specific wiring density for each type of board cannot be manufactured. For example, a Pentium® bare chip of Intel Corporation has a pad space of 85 μm and, in order to mount this bare chip, footprints with a space narrower than the manufacturing limit of conventional wiring on built-up boards must be formed.

Therefore, assuming that a footprint width of 50 μm is the manufacturing limit, the clearance between the footprints is at maximum only 35 μm, and consequently, many faulty boards with insufficient insulation are manufactured, resulting in a poor production yield. In order to improve the manufacturing precision of boards, if plating and etching solutions are strictly controlled, these solutions must be replaced every time and the production costs become extremely high. Furthermore, because only those solutions with a limited pH value can be used, production costs are yet further increased. Moreover, if these solutions are replaced every time, the subsequent heating to the specified temperatures takes a long time, thereby limiting the number of products manufactured daily and resulting in increased costs.

If the width of each of the footprints is 35 μm, the number of insulation failures can be reduced and the production yield of boards can be improved, but the footprint areas are reduced. For this reason, when a bare chip is mounted, the mounting position tends to shift slightly or a slight position shift during bump forming causes conduction failure between the bare chip and the board. As a result, manufacturing defects are likely to occur at the packaging stage and such manufacturing defects in finished products whose price is higher than the unit price of boards result in increasing the overall cost. In order to avoid such disadvantages, such manufacturing defects could be reduced in number by doing a visual check of the external appearance of bumps during their formation, and removing bare chips with even slightly shifted bumps as being faulty. However, this adds a process of visually inspecting bumps, and the failure rate of bare chips increases, resulting in increased costs. Furthermore, by narrowing the widths of footprints, the areas of footprints are reduced and the adhesive strength between copper foil and polyamide used as the insulation layer is weakened. Consequently, the increased number of defects, such as peeled-off copper foil forming footprints when pressing a bare chip onto a board, increases production costs.

By taking a middle ground between these cases, by forming footprints each 40 μm wide and visually checking them and discarding faulty boards having footprints each less than 40 μm wide, the production cost is kept low. However, because of the addition of the process of inspecting footprint appearance and where only one of a plurality of footprints on a board is defective the board is considered to be faulty, the production yield of boards can hardly be expected to improve.

Because the spaces between pads on a bare chip is narrow, the spaces between bumps formed on pads are also narrow, and the productivity of products on which bare chips are mounted is adversely affected.

SUMMARY OF THE INVENTION

The present invention solves the above problems and provides a high production yield for the packaging structures of semiconductor elements.

A first exemplary embodiment of the packaging structure of the present invention consist of a packaging structure for a semiconductor element in which electrodes are formed on pads arranged in parallel with the semiconductor element, said electrodes being formed at positions shifted from the center of said pads, and the positions are alternately shifted in opposite directions. From this, spaces between electrodes are widened, improving productivity because a sufficient insulation resistance can be attained even if the formed position of the electrodes shifts to some degree.

A second embodiment of the packaging structure of semiconductor elements in the present invention includes bumps on the electrodes formed on said pads, where the semiconductor element is mounted face-to-face with the board mounting the semiconductor elements.

Because the spaces between the bumps is wider, the workability of such processes as pouring bonding resin is improved and the productivity of flip-chip mounting is improved.

A third embodiment of the packaging structure of semiconductor elements in the present invention includes footprint on the mounting board having a wider portion formed correspondingly to the bumps than the width of the other portion of the footprint. For this reason, it is possible to prevent board failure caused by insufficient footprint widths, so the productivity of boards improves; peeling off of footprints is prevented as semiconductor elements are mounted; and, even if the mounting position of a semiconductor element shifts slightly, connections can be ensured, thereby improving productivity when mounting semiconductor elements.

A fourth embodiment of the packaging structure of semiconductor elements of the present invention features multiple footprints formed adjacently. The portion of each footprint adjacent to the wider part of another footprint is narrower than any other portion. Because this feature maintains the space between footprints, a sufficient insulation resistance can be attained and PC board production is improved.

BRIEF DESCRIPTION OF THE DRAWINGS

FIGS. 1(a)–1(e) are diagrams showing different views of a packaging structure of semiconductor elements in a preferred exemplary embodiment of the present invention.

FIGS. 2(a)–2(h) are diagrams showing different views of a packaging structure of semiconductor elements in a second embodiment of the present invention.

DETAILED DESCRIPTION OF THE PREFERRED EMBODIMENTS

Figure 3A:
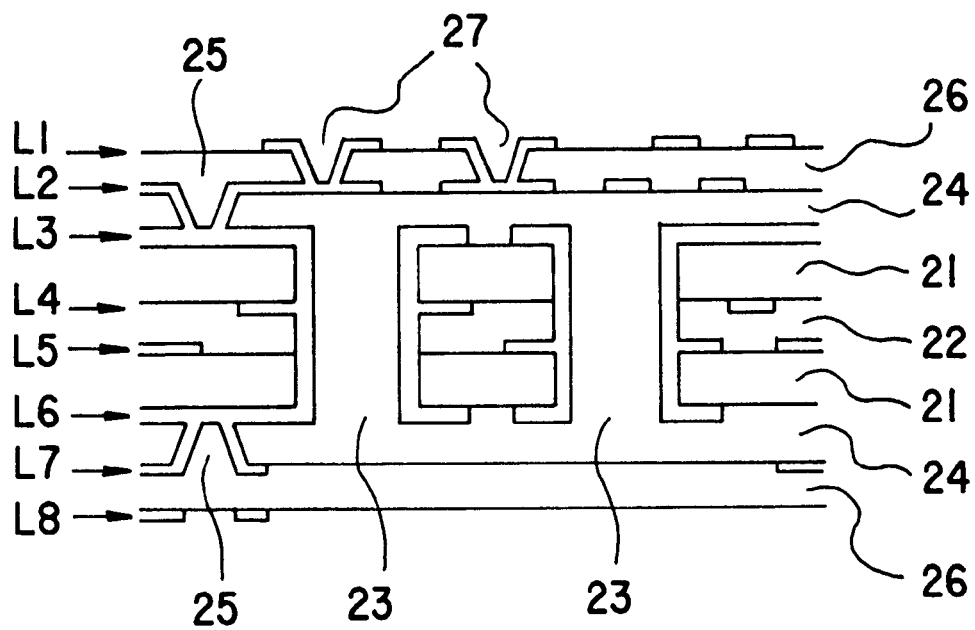
FIGS. 3(a)–3(b) are diagrams showing packaging structures of semiconductor elements in the third and fourth embodiments of the present invention.

FIGS. 1(a)–1(e) show a packaging structure of semiconductor elements in a preferred exemplary embodiment of the invention, and show the process of forming gold electrodes on pads of a bare chip by a wire bonding apparatus. FIG. 1(a) is a diagram of the side view of the bare chip, FIG. 1(b) is a diagram of the bare chip at the view from the direction indicated by arrow A in FIG. 1(a), FIG. 1(c) is a diagram of the side view of the bare chip as similar to FIG. 1(a), FIG. 1(d) is a diagram of the bare chip at the view from the direction indicated by arrow B in FIG. 1(b) and shows a state in which a bare chip is mounted on a package, and FIG. 1(e) is a diagram of the side view of the bare chip as similar to FIG. 1(a) and FIG. 1(c).

As shown in FIG. 1(a), by supplying a gold wire 5 to a capillary 4, and by heating the end of the gold wire 5 with an arc discharge, a ball 6 is formed. Next, as shown in FIG. 1(b), the gold wire is positioned to a location 3-1 which is a position shifted upward in the figure from the center of a pad 2-1 at which the gold wire is bonded at position 3-1 and, as shown in FIG. 1(c), the ball 6 is pressed against the pad 2, and fixed with heat and force After that, as shown in FIG. 1(d), the gold wire 5 is supplied, the capillary 4 is moved up and to an another pad 10, and is then fixed with heat and force. Then the looping of gold wire 5-1 is carried out and the connection is made. When gold wire 5 is pinched and held, the supplying is stopped, and the gold wire 5 is cut by moving up the capillary.

Alternatively, it is possible to form bump 3 in a manner such that after the ball 6 is fixed to the pad 2 by heating and pressing as shown in FIG. 1(c), the supplying of the gold wire 5 is stopped as shown in FIG. 1(e) and the capillary is moved up so that the gold wire 5 is cut immediately above the ball 6. After the completion of the process shown in FIG. 1(d) or FIG. 1(e), a ball 6 is formed by returning to the process as shown in FIG. 1(a). And, as shown in FIG. 1(b), the positioning to a pad 2-2 next to the previous pad 2-1 is made. At this time, as shown in FIG. 1(b), the positioning to a position 3-2 is shifted downward in the figure, which is the opposite direction than that of the pad 2-1. Then, a ball 6 is bonded as shown in FIG. 1(c) in the same manner as described above, and then either a wire bonding 5-2, as shown in FIG. 1(d), or a bump bonding, as shown in FIG. 1(e), is made. Next, FIG. 1(d) is positioned to a pad 2-3 as shown by 3-3, and then the previously-described process for all pads 2 formed on the bare chip is repeated, and gold wires 5 can be bonded at alternatively shifting positions.

As described above, because the bonding positions of gold wires on pads of a bare chip are alternatively shifted, the spaces between the gold wires can be widened and the manufacturing error rate of the wire bonding apparatus can be reduced. In particular, in the case of wire bonding, the spaces between the gold wires to be looped are widened, and thereby the rate of causing the short-circuiting between adjacent gold wires is reduced. Furthermore, in a bump bonding, since the spaces between the bumps are widened, even when a gold wire is bonded and cut, a cut portion remains long, the cut portion falls down toward an adjacent bump, and the possibility of short-circuiting is reduced compared with the forming of bumps with pad space. Moreover, at the center of a pad on a bare chip a mark of a probe which is made in a shipment test by a manufacturer may not be flat, so a bonding error may occur. However, by bonding on a decentralized position from a center of a pad, bonding failures caused by the probe trace are prevented.

FIGS. 2(a)–2(b) are diagrams for explaining the second embodiment of the present invention and show a process of mounting bare chips face down in which a circuit side surface of a bare chip faces a substrate, and also shows a process of mounting to a substrate a bare chip on which bumps are formed by a flip-chip bonding apparatus called a flip-chip bonder.

FIG. 2(a) shows a bare chip 1 on which bump 3 is formed by a bump bonding apparatus called, such as a wire bonder or a bump bonder. In addition, the bare chip 1 shown in FIG. 2(a) is a vertically inverted version of that shown in FIGS. 1(a)–1(e). As shown in FIG. 2(a), the bare chip 1 is held by a vacuum suction hole 13 on a bonding tool 12. To make uniform the heights of the bumps 13, the bonding tool 12 is moved to a position at the glass 7. Next, as shown in FIG. 2(b), the bonding tool 12 is moved downward such that the end of the bump 3 is pressed against the glass 7. From this, a cut portion of the wires remaining at the end of the bump 3 is squashed such that the heights of bumps formed on the bare chip are made equal. Next, as shown in FIG. 2(c), the bare chip 1 is moved by the bonding tool 12 to a place at which a thin layer of liquid conductive adhesive 8 containing a silver filler, such as Ag paste or Ag slurry, is spread, and then, the ends of the bump 3 is soaked into the conductive adhesive 8 by moving the bonding tool 12 downward. Next, as shown in FIG. 2(d), when the bonding tool 12 is moved up, conductive adhesive 8 is applied to the end of the bump 3 by the viscosity and surface tension of the conductive adhesive 8. In addition, in parallel with the processes shown in FIGS. 2(a)–2(d), as shown in FIG. 2(e), a sealing agent 11 which is made of a thermosetting resin, such as potting resin (underfill) is applied to the center portion which is surrounded by footprint 10 of the board 9 and which is a bare chip mounting position 1' indicated by the dotted line. FIG. 2(e) is a diagram of a board mounting a bare chip at the view from the bare chip mounted side. The main purpose of the sealant 11 is to cover the entire surface of a circuit formed on the bare chip 1 and the side surfaces. Therefore, a sufficient amount of sealant 11 spread on the board 9 is set to an amount which can be spread around the bare chip 1 to cover the sides of the bare chip 1, during which the bare chip 1 is mounted. Next, as shown in FIG. 2(f), the bonding tool 12 is positioned such that the bumps 3 on the bare chip 1 are faced toward the footprints 10 on the board 9 to which the sealant 11 has been applied. The bonding tool 12 is moved downward, and then each bump 3 is pressed onto a footprint 10 and, thereby, as shown in FIG. 2(g), the sealant 11 is spread around the bare chip 1 through the space between the bumps 3, which are arranged in a staggered layout. At this time, because the bumps 3 are staggered, the gap between each bump 3 is widened, and therefore, even if the amount of sealant 11 required just covers the sides of the bare chip, its flowability is improved, and it flows into the all spaces between the bumps 3. Then, as shown in FIG. 2(h), the sealant 11 is then spread around the bare chip 1 to form a fillet 11' and to cover the sides of the bare chip 1. Also, most of the conductive adhesive 8 flows into dented parts which were made by pressing the capillary during the formation of the bumps 3. Then, the conductive adhesive 8 not only causes a protrusion of the bumps 3 and the footprints to be in contact, but also lowers the connection resistance because of affecting the conductive range around it. Moreover, the conductive adhesive 8 allows for slight positional shifts, thereby improving the production yield. In addition, the conductive adhesive 8 also has a function of absorbing the differences in space between the bumps 3 and the footprints 10 which were caused by uneven heights of bump 3 and uneven heights of footprints 10, thereby improving the production yield. Thereafter, the vacuum state of the vacuum suction hole 13 provided with the bonding tool 12 is released, and then the bonding tool 12 is moved upward. After that, the board 9 is moved to the heating process, the board 9 is heated with the sealant 11 and the conductive adhesive 8, and therefore the bare chip 1 is fixed to the board 9. By thermally hardening the sealant 11, the sealant 11 shrinks during cooling down so that the stress pressing the bare chip 1 against the board 9 is maintained. This stress is applied to the bumps 3 and the footprints 10 and functions to apply pressure to the respective connection points of bumps 3, the silver filler contained in the conductive adhesive 8, and the footprints 10. At these connection points, the metal diffusion occurs between the respective metals, and an alloy layer is formed at the boundary between the metals, respectively. Since such alloy layers are formed, the bumps 3 and the footprints 10 are tightly connected both electrically and mechanically. Also, the method of forming bumps by using gold wires was described, but bumps can also be formed by bonding gold balls.

The structures and processes described above allow sealant to flow into all spaces between the bumps 3, and therefore the insulation characteristic between bumps 3 is improved, and a fillet is formed all around the bare chip so that the circuit-printed surface of the bare chip can be completely protected.

Furthermore, because narrow spaces are formed between bumps 3 by using the conventional method, sealant rarely does not flow into the space between bumps 3. In such cases, humidity penetrates spaces at which the sealant did not flow into, and ionizes the bumps 3 and the footprints 10 by the influence of humidity, the ionized metal may spread at the spaces and cause a dielectric breakdown. Since the sealant flows into all spaces between bumps, however, the bumps 3 are not exposed to humidity. Thus, even if a board manufactured by applying this invention is exposed to high temperature and a high humidity environment for a long time, the deterioration of the insulation characteristics can be prevented.

Figure 3B:
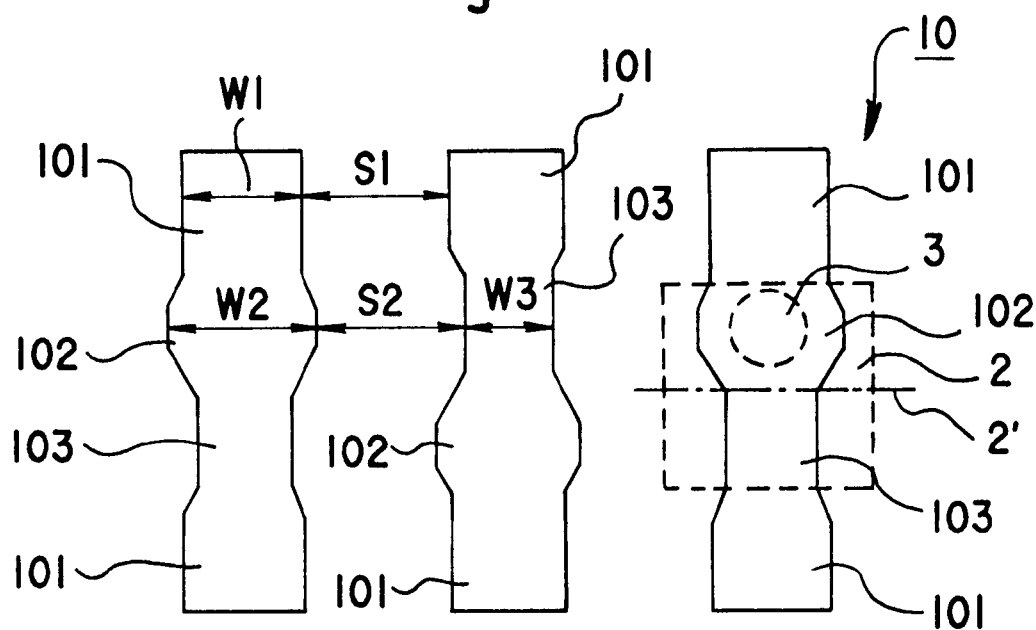

FIG. 3(a) and FIG. 3(b) are diagrams showing packaging structures of semiconductor elements in the third and fourth embodiments, respectively, of the present invention, and show the structure of a board mounting the bare chip, as explained with reference to FIGS. 2(a)–2(b).

FIG. 3(a) is a diagram showing a cross-sectional view of the multi-layered board used in the present invention. Wiring layers L3–L6 form circuits on a copper-pasted plate 21 with copper plates pasted on both sides. The copper-pasted plate 21 is positioned so that the through-holes 23 are aligned in the same position, and is then adhered by heating and pressed in a state in which an insulated adhesive seat is pinched. After having been mechanically connected, the through-holes are plated. Thereby, an electrical connection between wiring layers L3 to L6 is established. At this time, the plating of the through-holes is also applied to the wiring layers L3 and L6, and then these wiring layers L3 and L6 become thicker than those of the wiring layers L4 and L5.

The multi-layered board formed by being pasted together is used as a core to form a polyamide insulation layer 24. A via hole is formed to form a layer connection via 25 for connecting the wiring layers L2 and L3 or L6 and L7. Then, in order to form a circuit by the wiring layer L2 and L7 a copper foil is formed on the insulation layer 24 by electrolysis plating. This plating forms the layer connection via 25. Then, the copper foil is etched to form circuitry of layer L2 or L7 is formed. Next, an insulation layer 26, via hole for forming a via 27, wiring layers L1 and L8 are then formed in the same.

Thus, because the wiring layers L3 and L4 are formed by pasting, the total cost of the board is reduced, and since the wiring layers L1, L2, L7, and L8 are formed by lamination, the forming of minute wiring patterns is enabled. Such boards formed by laminating wiring layers on a board, such as a core PC board, are called built-up boards.

FIG. 3(b) is a diagram showing a shape of footprints exceeding the manufacturing limit having a pitch narrower than the wiring density of wiring layer L1, which is one of the footprints formed on the wiring layer L1 mounting the bare chip of the multi-layer board as shown in FIG. 3(a). In the figure, 2 indicates the pad position on the bare chip, 2' indicates the center line of the pad 2, 3 indicates the bump position, and 10 indicates the footprints on the board.

Each footprint 10 formed on the board is constructed with reinforced parts 101, a widened part 102, and a narrowed part 103. The widened part 102 and the narrowed part 103 are formed corresponding to the part divided from the center line 2' in the longitudinal direction of pad 2 on the bare chip. The reinforced parts 101 are portions provided for increasing the area of the footprint in order to ensure the strength necessary to secure the footprint 10 to the board, and are formed to have the same width as that of the footprint 10. Thus, the space S1 of the reinforced part 101 has the same distance as that of conventional one. The widened part 102 is formed to be wider than the width W1 of the reinforced parts 101 in order to ensure the strength in which the footprint 10 is not peeling off even if the footprint 10 deforms when the bump 3 is pressed at the time which the bare chip is mounted. In other words, the reinforced parts 101 secure the strength of the entire footprint 10, and the widened part 102 ensures the strength for resistance against the pressing force of the bump 3. The narrowed part 103 is a portion for securing space S2 from the widened part 102 of the adjacent footprints 10, and is formed narrower than the width W1 of the reinforced parts 101. The intermediate portion is tapered to prevent reduction in the spaces between the footprints 10.

This structure enables the area of a footprint 10 to be made almost equal to that of a conventional footprint, and the connection strength of the footprints 10 to the board can be equal to the conventional strength. Because space S between footprints 10 can also be made equal to that of a conventional footprint, the same yield can be obtained through a manufacturing process identical to the conventional process. Thus, while maintaining the required performance conventionally, the portion of footprints 10 onto which bumps 3 are mounted can be made wider, and the various effects described above can be obtained.

Figure 4:
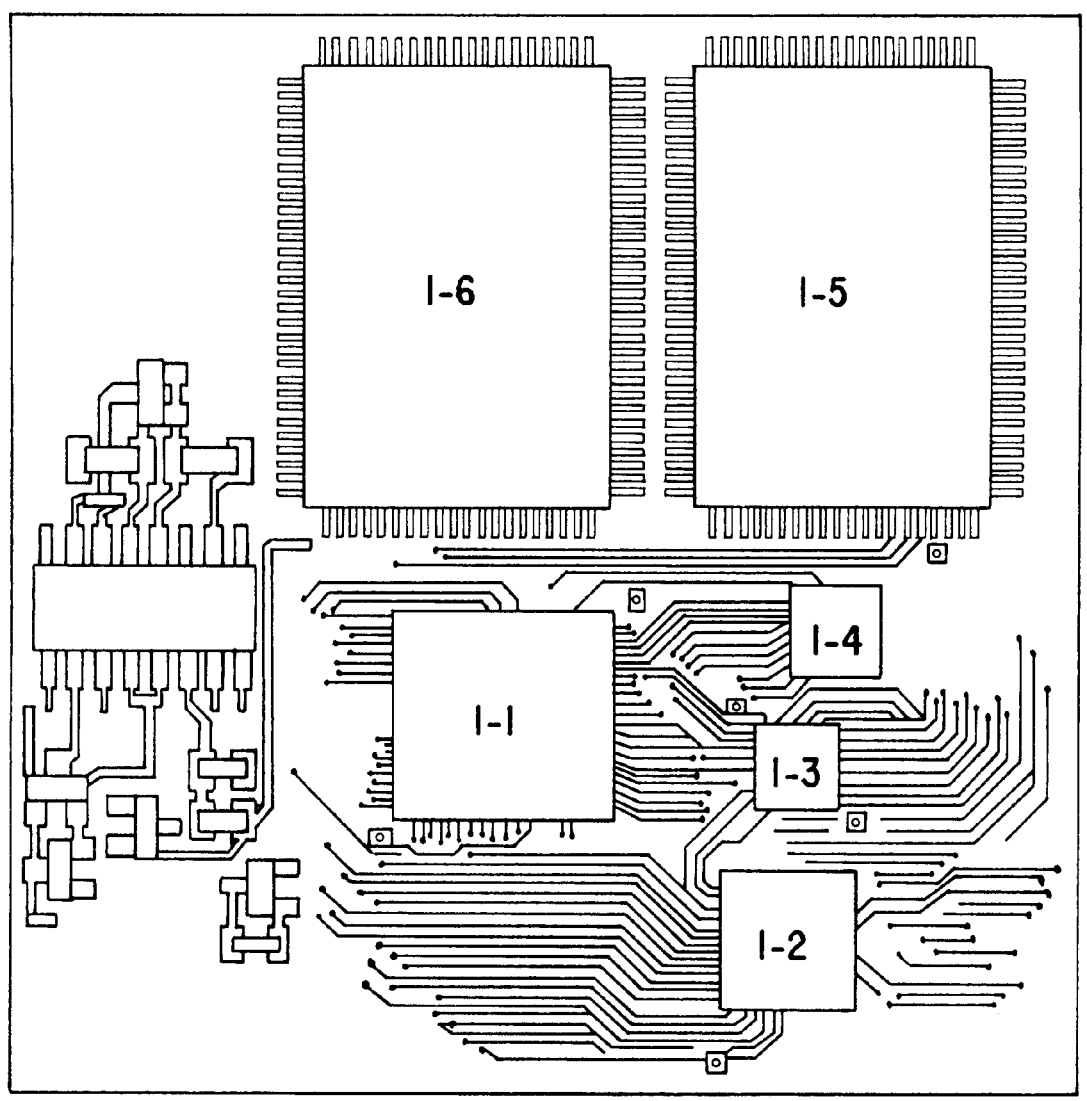
FIG. 4 is a plan view of a board implementing the present invention.
Figure 5A:
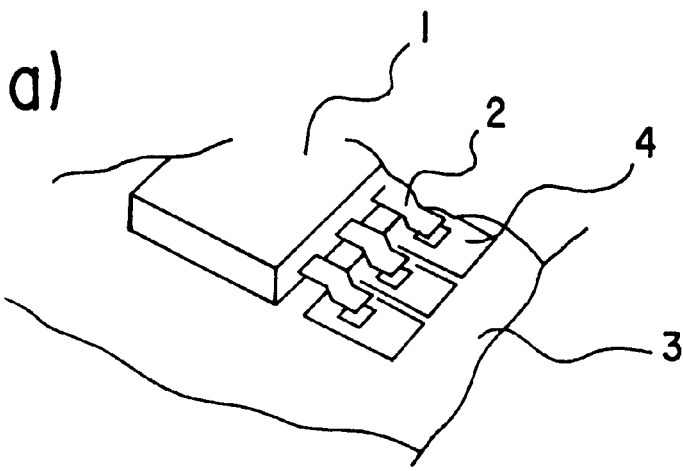
FIGS. 5(a)–5(c) show different prior art high-density mounting structures of semiconductor elements on a PC board.
Figure 5B:
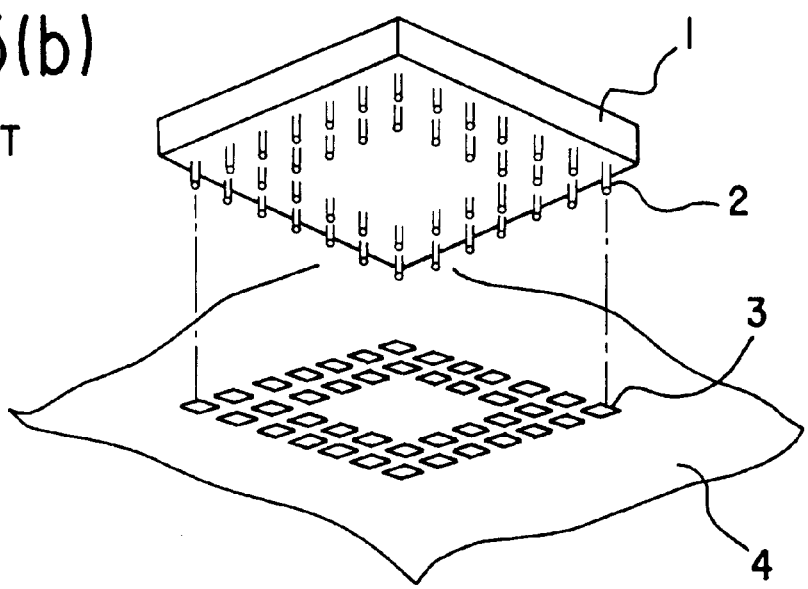
Figure 5C:
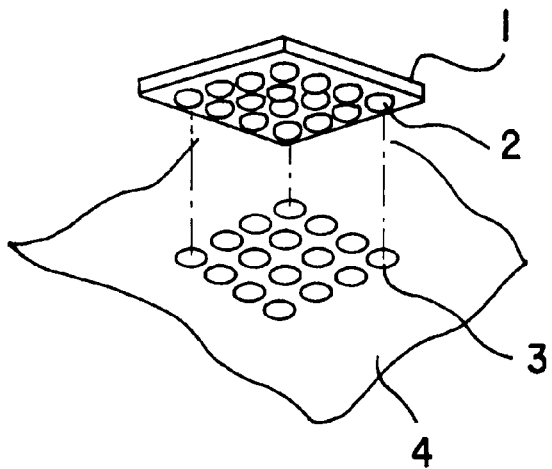
Figure 6A:
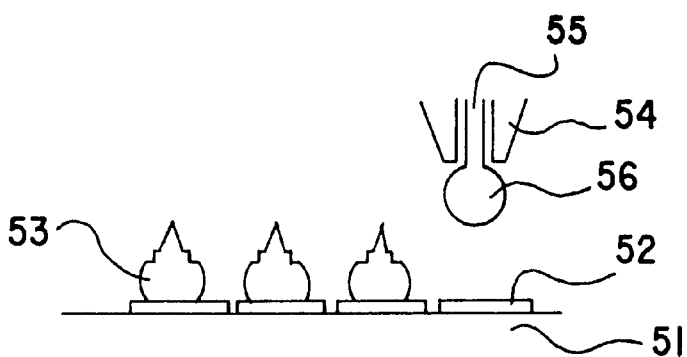
FIGS. 6(a)–6(e) are diagrams explaining a prior art mounting method of a bare chip onto a board.
Figure 6B:
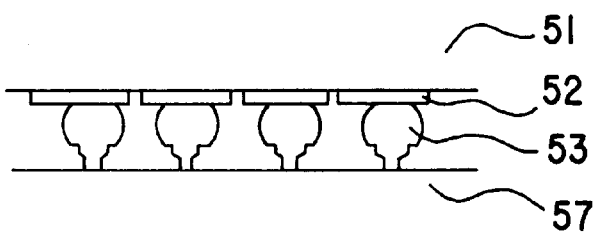
Figure 6C:
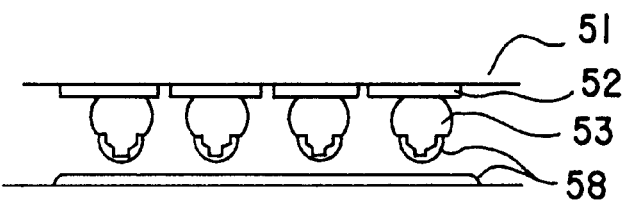
Figure 6D:
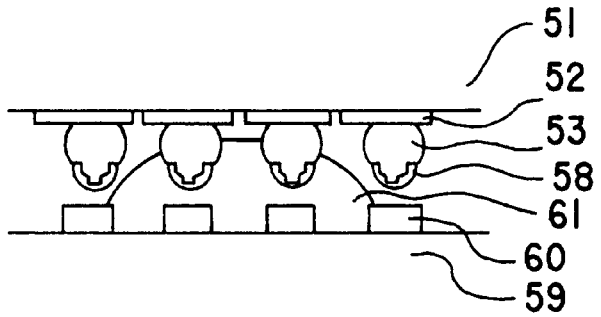
Figure 6E:
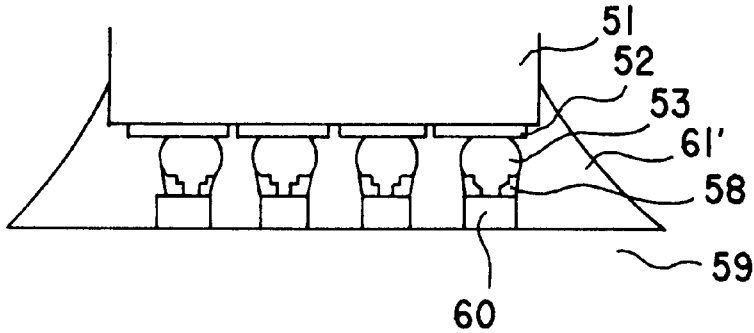
Figure 7A:
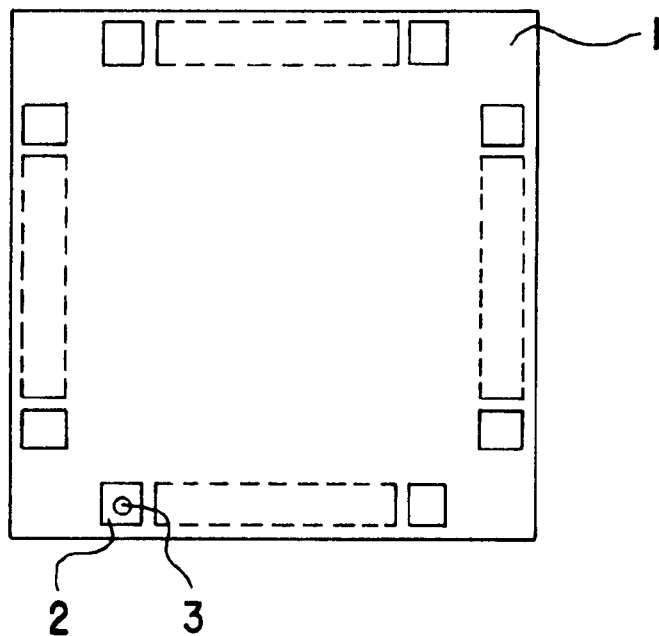
FIGS. 7(a)–7(b) are diagrams showing a bare chip and footprint on a board.
Figure 7B:
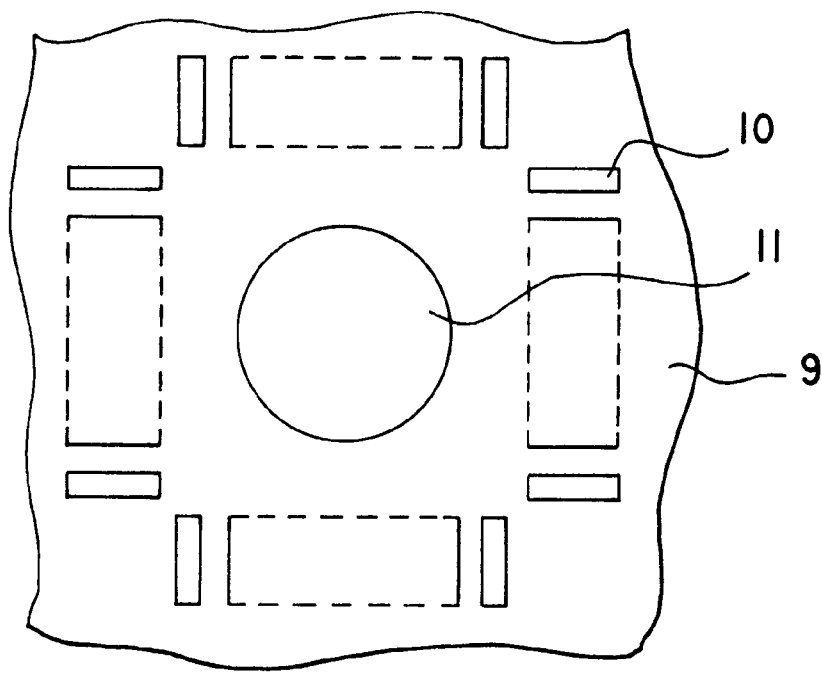

FIG. 4 is a diagram showing a multi-chip module on which four bare chips are mounted by flip-chip bonding and the other is surface-mounted type chips. In the figure, 1-1 denotes a Pentium® chip, and is a bare chip on which pads are formed with a pitch of 85 μm. 1-2 to 1-4 denote bare chips, such as PCI chip sets. The chip set 1-2 of these PCI chip sets with the largest number of terminals has pads in double rows around it, the pad space is 110 μm, which is rather wide when compared to the wiring density. Therefore, each pad is formed to be rectangular in shape. 1-5 and 1-6 denote cache memory devices, and are surface-mounted type packages. As shown in the figure, each cache memory has lead wires around it, where footprints for connecting these lead wires are formed sufficiently wider than the wiring pattern which forms a signal line.

This invention applies to bare chip 1-1, which is the most effective multi-chip module with the above structure. Also, a footprint for mounting bare chip 1-1 has a W1 of 35 μm, a W2 of 45 μm, and a W3 of 25 μm, as shown in FIG. 3(*b*). The offset amount of the adjacent widened parts 102 is 57 μm. The pad size on the bare chip 1-1 is 67 μm wide and 141 μm long. Therefore, widening the offset amount to 74 μm makes it equal to the margin of the width. By shortening the amount of offset from 74 μm to 57 μm, a yield that matches the conventional rate can be obtained. To form a footprint of the above size, a slightly wider mask is formed. The mask width corresponding to the reinforced parts 101 is 60 μm, the mask width corresponding to widened part 102 is 75 μm, the mask width corresponding to narrowed part 103 is 55 μm. The space between the widened parts 102 and the narrowed parts 103 and the space at a tapered portion of which the widened parts 102 face each other are the narrowest on the mask. However, because each space is secured at 20 μm, a footprint approximating the above design size can be formed.

If a conventional rectangular footprint is etched with a mask 60 μm wide, unevenness occurs in the 38 to 45 μm range, and footprints less than 40 μm wide are formed on ten percent of these boards. By increasing the footprint width to 45 μm at a position for mounting bumps, however, the footprints do not become less than 40 μm and the board production yield is improved by about ten percent. By making the footprints adjacent to the above footprint 25 μm wide, the same space as that between conventional footprint can be secured, and the insulation characteristics can be maintained. Moreover, all footprints at the bump mounting positions of the board can be more than 40 m wide, and therefore, the process of inspecting footprint widths by an optical surface inspection can be eliminated and thus improve production. Bare chips and surface-mounted type parts mounted on boards have been found to pass the board unit test, but only 98 percent of products have been found to pass the test for finished multi-chip modules. Elimination of the inspection process of the board test is by using footprints of the present this invention enables 99 percent of the products to pass the test for finished multi-chip modules with the error rate reduced by half. No failures were detected when tested under the environmental conditions of high temperature and high humidity.

As described in detail thus far, the packaging structure of semiconductor elements of the preferred exemplary embodiment of the present invention widens the space between electrodes and, consequently, production is improved because a sufficient insulation resistance is provided even if the position of each electrode slightly shifts.

The second embodiment of the present invention widens the space between bumps to improve the workability of pouring potting resin, and consequently, the production of flip-chip bonding is improved.

The third embodiment of this invention improves board production because board failures caused by an insufficient footprint width can be eliminated, the peeling off of footprint can be prevented when mounting the semiconductor elements, and the process of mounting semiconductor elements is also improved because connections can be secured even if the mounting position of a semiconductor element shifts slightly.

The fourth embodiment of this invention secures space between footprint equivalent to that of conventional footprint, and consequently, a sufficient insulation resistance can be provided and PC board production improved.

What is claimed is:

1. A packaging structure for a semiconductor element flip-chip mounted on a mounting board, comprising:

a plurality of rectangularly-shaped pads arranged on the semiconductor element;

a plurality of bumps formed on said plurality of pads at positions shifted from a center of said pads; and a sealing agent placed on said mounting board for sealing mounted positions of said plurality of bumps on said mounting board by spreading through gaps between adjacent bumps, wherein the positions of said plurality of bumps on said plurality of pads are alternately shifted in opposite directions for each adjacent one of said plurality of pads.

2. The packaging structure as recited in claim 1, wherein said plurality of bumps have a construction consisting of a portion of a gold wire.

3. The packaging structure as recited in claim 1, further comprising conductive adhesive for adhering ends of said plurality of bumps to the mounting board.

4. A method of flip-chip mounting a semiconductor element on a mounting board, comprising the steps of:

forming a plurality of bumps on a plurality of rectangularly-shaped pads at positions shifted from a center of said pads, the positions being alternately shifted in opposite directions for each adjacent one of said plurality of pads, where each of said bumps is formed on one of said pads;

providing a sealing agent on the mounting board; and placing the plurality of bumps on the mounting board such that the sealing agent spreads through gaps between adjacent bumps to seal the mounted positions of the plurality of bumps on the mounting board.

5. The method of flip-chip mounting of a semiconductor element as recited in claim 4, further comprising the step of making the plurality of bumps from gold wire.

6. The method of flip-chip mounting of a semiconductor element as recited in claim 4, further comprising the step of adhering ends of said plurality of bumps to the mounting board with conductive adhesive.

* * * * *